United States Patent [19]

Pang et al.

[11] Patent Number: 5,017,403
[45] Date of Patent: May 21, 1991

[54] PROCESS FOR FORMING PLANARIZED FILMS

[75] Inventors: Stella W. Pang, Arlington; Mark W. Horn, North Chelmsford, both of Mass.

[73] Assignee: Massachusetts Institute of Technology, Cambridge, Mass.

[21] Appl. No.: 337,299

[22] Filed: Apr. 13, 1989

[51] Int. Cl.$^5$ ............... C23C 16/08; C23C 16/26; C23C 16/50; C23C 16/56
[52] U.S. Cl. .................... 427/39; 427/41; 427/250; 427/255.1; 427/255.2; 427/377; 427/383.1; 156/643
[58] Field of Search ........... 427/38, 39, 40, 41, 427/250, 377, 383.1, 255.1, 255.2; 156/643; 428/408

[56] References Cited

U.S. PATENT DOCUMENTS

| | | | |
|---|---|---|---|
| 4,524,089 | 6/1985 | Haque et al. | 427/38 |
| 4,626,448 | 12/1986 | Hays | 427/39 |
| 4,663,183 | 5/1987 | Ovshinsky et al. | 427/39 |
| 4,681,653 | 7/1987 | Purdes et al. | 156/614 |
| 4,889,767 | 12/1989 | Yokoyama et al. | 427/41 |

OTHER PUBLICATIONS

VLSI Technology, Second Edition, Edited by S. M. Sze, AT&T Bell Laboratories, pp. 227-228, 1988, 1983.

*Primary Examiner*—Norman Morgenstern
*Assistant Examiner*—Margaret Bueker
*Attorney, Agent, or Firm*—Hamilton, Brook, Smith & Reynolds

[57] ABSTRACT

A planarization process and apparatus which employs plasma-enhanced chemical vapor deposition (PECVD) to form plarnarization films of dielectric or conductive carbonaceous material on step-like substrates.

19 Claims, 6 Drawing Sheets

PLANARIZATION LAYER REMOVED AFTER CONTACT IS FORMED

PLANARIZATION LAYER STAYED IN THE CIRCUIT AS DIELECTRIC LAYER

PLANARIZATION LAYER DEPOSITED OVER MOUNTED HYBRID CIRCUITS

OPENING VIAS IN PLANARIZATION LAYER

MULTIPLE INTERCONNECTIONS

PROCESS FOR FORMING PLANARIZED FILMS

GOVERNMENT SUPPORT

The Government has rights in this invention pursuant to Contract No. F19628-85-C-0002 awarded by the United States Air Force.

BACKGROUND ART

Integrated circuit (IC) complexity has grown over the years to the present state of very-large-scale integration (VLSI) in which $10^5$ or more components are fabricated on a single chip. Research and development efforts are now being directed toward ultra-large-scale-integration (ULSI) wherein $10^7$ or more components must be incorporated on a single chip. One avenue of achieving this degree of integration is the use of high density circuits with multi-level metallization.

Conventional multi-level metallization processes require "planarization" for producing a planar upper surface over a lower stepped component or patterned surface formed on a substrate. A metallization or dielectric layer is then formed on the planar surface and patterned to interconnect components on the lower surface.

One system for providing a smooth upper planarization surface is to deposit a dielectric, such as phosphorous-doped silicon dioxide ($SiO_2$) called P-glass, over the stepped or patterned surface and flow the dielectric at high temperature (greater than 800° C.).

When the highest allowable substrate temperature is less than the dielectric flow temperature, this high temperature flow process is not practical and etching techniques are required to planarize the dielectric. Sze in *VLSI Technology* 2nd Ed. 1988, p. 227, describes two such techniques.

One is to spin a resist, or any other polymeric layer, onto the irregular dielectric film which is deposited thicker than is necessary for the final structure. This results in smoothing of the new top surface. This new surface is then transferred into the dielectric by etching in a reactive plasma that etches the resist and dielectric at the same rate. Alternatively, more dielectric than is necessary can be deposited and the resultant corrugated top surface is then etched in a reactive ion etch (RIE) mode.

Another approach is to sputter deposit the planarization dielectric layer using high energy particles generated by an R.F. bias in a magnetron sputter deposition system or electron cyclotron resonance chemical vapor deposition (CVD) system. The high energy ions etch and facet the deposited dielectric material and form a planar coating of dielectric on the stepped surface.

Planarization is essential in VLSI technology for avoiding step coverage problems and for high resolution lithography that has a short depth of focus. Yet, the three systems described above suffer from a number of distinct limitations.

The first system, i.e., thermal reflow of P-glass, is typically performed at temperatures above 700° C. and is therefore not available for devices that have low thermal budget or tolerance. For example, this requirement leaves out all aluminum based circuits. The second system, i.e., coating with a chemical is a wet process with attendant waste disposal problems, wafer cleanliness and handling problems and yield problems. The third system, bias sputtering, requires complex equipment and has a relatively slow deposition rate of 20 nm/min. Also, the high ion energy seen by the samples during deposition can cause device damage.

Furthermore, both the spin coating and bias sputtering techniques require relatively thick planarization films or layers of 4–5 microns and the resultant planarization is less than 70%.

A need exists, therefore, for a planarization film and process which can be produced at relatively low temperatures (approximately 20° C.), does not require wet chemicals, or complex equipment and high ion energy and deposits at high deposition rates (in the order of up to 250 nm/min) with a high degree of planarization (preferably about 80–90% or higher) using a thin layer no more thick than the step height of the underlying profile.

SUMMARY OF THE INVENTION

In accordance with the present invention, a method, apparatus and resultant structure is provided which satisfies the above needs and requirements. The invention comprises a planarization system in which a planarization layer is deposited by a plasma enhanced chemical vapor deposition (PECVD) process, in which corrugated or stepped profile substrates are introduced into a PECVD reaction chamber for planarization.

The reaction chamber comprises a low vacuum environment with oppositely disposed first and second electrodes coupled across an external source of R.F. power. Reactant gases from an external source are introduced to a reaction zone or region between the two electrodes. The first electrode is left at room temperature and the second at low temperature, i.e., zero or less, or elevated, but still relatively low temperature (less than about 400° C.). A heater, for example, an internal resistance heater or external UV lamps, etc., may be used for elevating temperatures, while a water cooled heat exchanger may be used for low temperature. The stepped surface substrate is disposed on the second electrode and heated or cooled to the electrode temperature. In general, to deposit soft or liquid films suitable for planarization, the following factors have been found to be important:

1. reactant gas composition
2. reactant gas flow rate
3. plasma R.F. power
4. reactor pressure
5. electrode/substrate temperature.

To produce good planarization films, i.e., soft films that flow over steps, the reactant or source gas composition preferably comprises gases which are in liquid phase at room temperatures, but have high vapor pressure to maintain high flow and high pressure during deposition. The flow rate should be high, and the R.F. power low. The reactor pressure should be high and the substrate temperature low.

A number of reactant gases have been found to be suitable for use in the process. These gases may vary depending upon the intended function of the planarization film over and above its planarization function. For example, in some applications, the film serves as an insulator and, hence, gases which produce dielectric films or films that can be converted to dielectric when dissociated by PECVD would be used. In other applications, the film may be patterned to produce an electrical interconnect structure, in which case, the reactant gases should produce a conductive film, such as p-doped polysilicon, or metals, such as Al, W, or T. These films should have the further characteristic of ease in patterning and good electrical properties. In other applications, the deposited film may serve as a sacrificial mask layer which is removed after it serves its function. These films should have the further characteristic of being readily dissolved without damage to the underlying structure.

Good insulator planarization films are formed by the above-described process using hydrocarbon gases, such as benzene (C6H6) or toluene (C6H5CH3), which produce amorphous carbon dielectric films. Good conductive planarization films are formed using metal containing gases, such as tungsten hexafluoride (WF6), or titanium tetrachloride (TiCl4), which produces W or Ti films, respectively.

After the soft planarization films are deposited, they are hardened by a variety of processes, such as, in-situ or external thermal or plasma treatment. In-situ hardening enables deposition of successive layers of soft planarization films with hardening steps in between layers, eliminating the need for further hardening steps.

The above, and other features and advantages of the invention, will now be described in connection with the drawings.

DETAILED DESCRIPTION OF THE INVENTION

Figure 1:
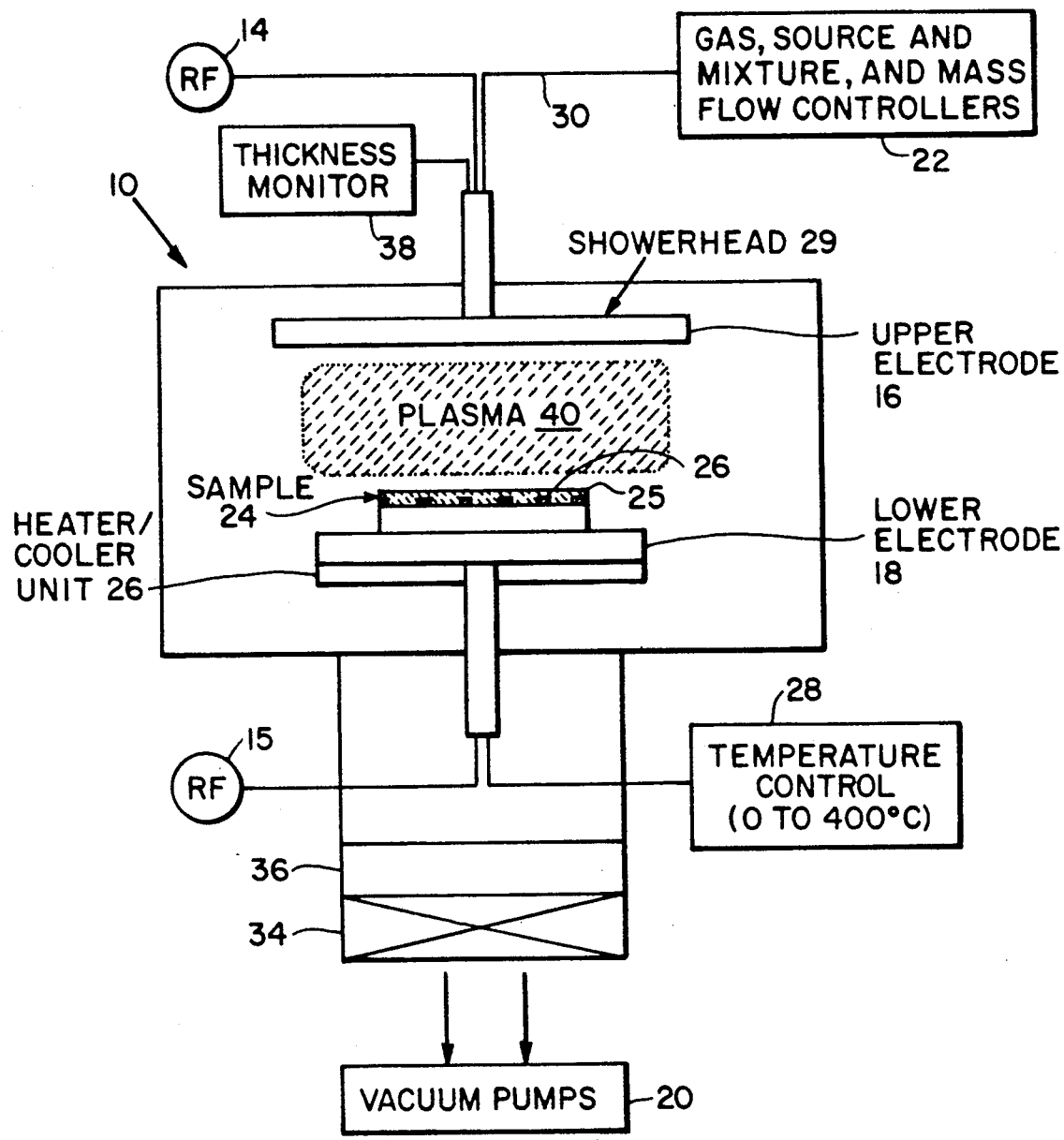
FIG. 1 is a schematic illustration of a PECVD system suitable for forming planarization layers in accordance with the invention.

FIG. 1 illustrates in schematic form a PECVD system 10 for use in the planarization process of the invention. The system comprises, in general, a vertical PECVD chamber 12, R.F. power sources 14 and 15 coupled across upper and lower electrodes 16 and 18, vacuum pumps 20 and a source 22 of reactant gases coupled to the chamber 12. The source 22 also includes a means for mixing gases and controlling the flow rate.

Substrate samples 24, having a corrugated profile 26, are disposed on one electrode, for example, the lower electrode 18. The electrode 18, upon which the sample 24 is disposed for planarization, is brought to a suitable temperature by heating/cooling unit 26 located in close proximity to electrode 18 and electrically controlled by temperature control unit 28. Unit 28 may comprise a resistance heater and/or a fluid cooler. Gasses are introduced from source 22 via port 30 in communication with shower head 29 on electrode 16.

A bellows 36 is provided to mechanically adjust the spacing between electrodes and, hence, controlling confinement of the plasma 40. Throttle valve 34 controls the pressure in the chamber 12 and an optical thickness monitor is provided to observe the thickness of the deposited planarization film 25.

The parameters that control the film characteristics include gas composition, gas flow rate, R.F. power, pressure and temperature.

A typical condition used for deposition is the following: Benzene (C6H6) is used as the source gas flowing at a rate of 50 sccm. The pressure is maintained at 750 mTorr by valve 34; with 50 W R.F. power applied to the top electrode 16 from R.F. source 14. Note: R.F. source 15 is not energized in this example and electrode 18 is grounded. The addition source 15 is provided for flexibility in the event it is desired to power the bottom or both electrodes simultaneously. The sample 24 is placed on the bottom electrode 18 with sample temperature maintained at 30° C. The resultant deposition rate is 230 nm/min and the film 26 is liquid-like and planar over 1 to 1 micron deep steps 26. Other gases used that provide planarized films include toluene (CH3-CH6H5); butadiene (C4H6); hexamethyldisilazane (HMDS—(CH3)6 Si-HN-Si); and L HMDS/Xylene [(CH3)2—C6H4]mixture. To obtain soft films that flow over steps, it is desirable to use low R.F. power (less than 150W), high pressure (more than 500 mTorr), high gas flow rate (more than 10 sccm), and low temperature (less than 100° C.).

In addition, the process works best when the source gases are in liquid phase at room temperature, but have high vapor pressure to maintain high flow and high pressure during deposition. Alternatively, the gas line could be heated to maintain high vapor pressure. (For comparison, a vapor pressure of 40 Torr is achieved for the following gases at the temperature indicated, C4H6—−61° C.; C6H6—8° C.; C6H5-CH3−32° C.; C6H4-(CH3)2—60° C.; C8H8—60° C.; HMDS—20 Torr at room temperature).

The deposition rate depends on the gas composition, is directly proportional to gas flow rate, power and pressure, and inversely proportional to temperature.

The hardness of the deposited film can also be modified by the addition of other gases, such as N2, N20, H2, NH3, SiH4, and Ar. The film remains soft and planar over steps when N2 or N20 are added. However, as H2, NH3 or Ar is mixed with the hydrocarbon source gas, the film becomes hard and conformal. It appears that inert gases or hydrogen radicals tend to harden the films by either causing more dissociation in the gas phase or reacting on the film surface.

Depending on the deposition conditions, the films can be soft and liquid-like, or hard and conformal. The soft films form a planar surface over corrugated features. For example, better than 95% planarization can be obtained using 1-micron-thick film for 20-micron-wide, can be dissolved in organic solvents, such as trichloroethane and chlorobenzene. The hard, conformal films are less reactive to the organic solvents and some are not soluble. Both the hard and soft amorphous carbon films can be easily patterned using oxygen reactive ion etching (RIE) at an etch rate of about 50 nm/min with better than 200 to 1 selectivity for inorganic masks (Ni, Al, Si).

The films deposited using gases, such as HMDS, or HMDS/Xylene mixture which contain Si the resultant films, contain 5 to 95% Si, depending on the deposition conditions. Because of the Si contents in these films, the etch rate in O2 RIE varies. There is insignificant etching (less than 1 nm/min) for films with more than 10% Si. These films can be used as an imaging layer and act as a good RIE mask. For films with low Si contents, they can still be easily patterned by RIE in O2 with F/Cl gas mixture. For example, HMDS films with 10% Si can be etched in O2/CF4 (1:3) RIE with an etch rate of 50 nm/min and better than 200 to 1 selectivity for metallic RIE masks (Ni, Al).

The soft and liquid-like films can be hardened by in-situ, thermal, or plasma treatment. The in-situ treatment can be applied during the deposition process where layers of soft films are deposited with hardening steps in between each layer. The deposited films will be planar and hard and no further hardening step is necessary. Without in-situ hardening, the films can still be hardened in the same deposition chamber or in a different chamber after deposition. Typical thermal treatment involve annealing the samples in N2 for 15 minutes at 120° C. The annealing ambient (N2, H2, Ar) does not make a substantial difference in the hardness of the films. Annealing in O2 at temperature greater than 200° C. tends to react with the film and reduce the film thickness. The higher the temperature and the longer the annealing time, the harder the film will be. Hardening can also be accomplished by exposing the soft films to plasma with low ion energy. N2 plasma gives the best result in surface morphology, although other plasma, such as H2 and O2, also works. Typically, the soft films are placed in an N2 plasma with 10 V dc bias voltage at 500 mTorr, 100° C. for 5 minutes. The plasma seems to allow hardening to be achieved at lower temperature and shorter time.

Figure 6A:
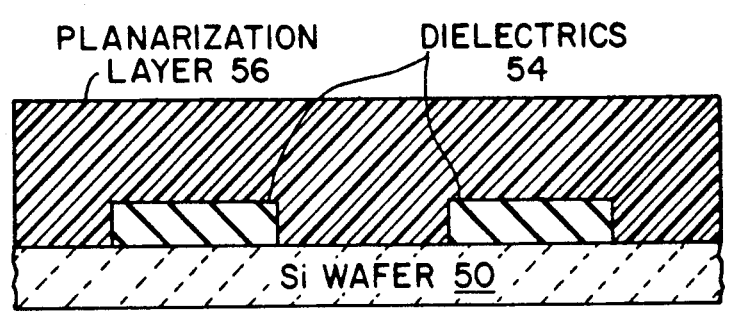
FIGS. 6(a) and 6(b) are is a schematic cross-sectional views of self-developed planarization process.
Figure 6B:
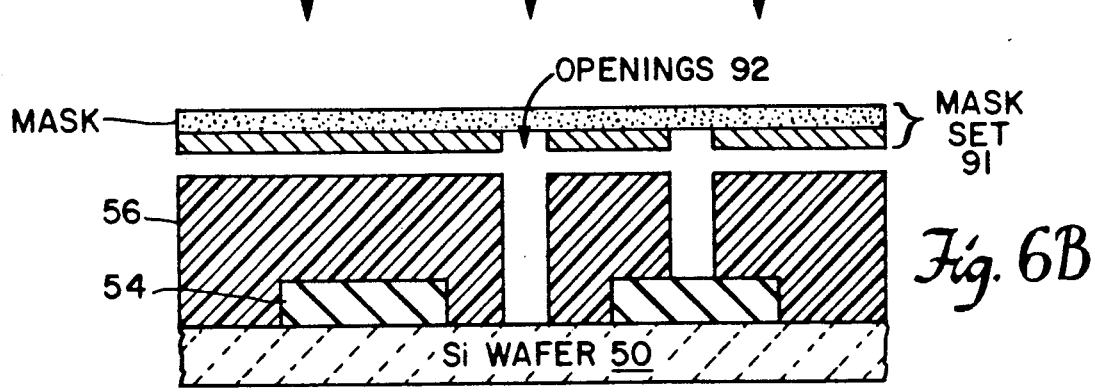

Because soft films can be self-developed by exposure to deep UV light (250 nm), at a rate of 10 nm/min, the conventional image layer and pattern transfer steps required in the other planarization processes may be eliminated as shown in FIG. 6. After forming a planarization layer 56 over a dielectric patterned substrate 50 (FIG. 6a), openings 92 may be formed directly through the soft layer by exposing the layer to light through a conventional mask set 90. The self-development rate decreases to half after the soft films were annealed at 100° C. for 15 minutes.

Experimental tests were conducted, in accordance with the invention, and the conditions and results are tabulated in Tables I and II below:

TABLE I

| Reactant Gas | Gas Flow | Pressure | R.F. Power | Substrate Temp. | Depth or Thickness of Film | Deposition Rate in Å per min. | Reactive Etch Rate O2-250 V | Solubility Time in Organic Solvents |
|---|---|---|---|---|---|---|---|---|
| C6H6 | 50 cc | 500 mtorr | 70 W | 27° C. | 32000 Å | 1800 | 500 | 5–10 s |
| C6H6 | 50 cc | 750 mtorr | 50 W | 30° C. | 25000 | 2500 | | 5–10 s |
| C6H6 | 50 cc | 750 mtorr | 50 W | 32° C. | 50000 Å | 2300 | | 5–10 s |
| C6H6 | 50 cc | 950 mtorr | 50 W | 25° C. | 40000 Å | 2350 | | 5–10 s |
| C6H6/Ar | 50/15 cc | 400 mtorr | 70 W | 31° C. | 14000 | 700 | 490 | 5–10 m* |
| C6H6/SiH4 | 25/10 cc | 400 mtorr | 10/5 W | 11° C. | 385 Å | 130 | | * |
| CH3—C6H5 | 40 cc | 200 mtorr | 100 W | 23° C. | 3000 | 380 | >300 | 2–10 m |
| CH3—C6H5 | 40 cc | 500 mtorr | 50 W | 12° C. | 15000 Å | 600 | | 5 s |
| CH3—C6H5 | 35 cc | 750 mtorr | 50 W | 32° C. | 25000 Å | 1190 | | 5 s |
| Xylene/N2 | 500 cc | 750 mtorr | 50 W | 12° C. | 5620 Å | 375 | 500 | 5–30 s |
| Xylene/N2 | 200 cc | 500 mtorr | 50 W | 17° C. | 4400 Å | 300 | 470 | no* |
| CH2=CH-Ph | 220 cc | 600 mtorr | 50 W | 26° C. | 8000 Å | 320 | 650 | no* |
| CH2=CH-Ph | 280 cc | 950 mtorr | 50 W | 28° C. | 5000 Å | 200 | 840 | no* |
| CH2=CH-Ph | 280 cc | 950 mtorr | 39 W | 31° C. | 4000 Å | 400 | 330 | no* |
| C4H6 | 20 cc | 750 mtorr | 50 W | 18° C. | 9000 Å | 800 | 550 | no |
| C4H6 | 40 cc | 500 mtorr | 150 W | 35° C. | 9000 Å | 600 | 530 | no* |
| C4H6 | 40 cc | 500 mtorr | 150 W | 35° C. | 14000 Å | 930 Å/min | | * |
| x - HMDS | 20 cc | 500 mtorr | 100 W | 34° C. | 10000 Å | 500 | 0 | 5–10 s |
| x - HMDS/Ar | 20/10 cc | 500 mtorr | 100 W | 34° C. | 7000 Å | 350 | 0 | 5 m* |
| x - HMDS/Ar | 20/10 cc | 500 mtorr | 100 W | 34° C. | 7000 Å | 600 | 0 | 5 m* |

*These films are relatively hard as deposited and did not have a high degree of planarization.
x - HMDS = 50/50 HMDS and XYLENE

TABLE II

| | Deposition conditions: | | | | | | | |
|---|---|---|---|---|---|---|---|---|
| Gas | Power (W) | Pres. (mTorr) | Flow (SCCM) | Temp. (C.) | Rate (Å/m) | Si % | RIE rate (Å/m) 250/100 V | Hardness |
| x - HMDS | 50 | 300 | 10 | 50 | 180 | 10 | 30/0 | soft |
| x - HMDS | 70 | 500 | 20 | 18 | ? | | | liquid |
| x - HMDS | 70 | 500 | 20 | 28 | 1000 | | | liquid |
| x - HMDS | 70 | 500 | 20 | 50 | 500 | 6 | 35/ | soft |
| x - HMDS | 100 | 500 | 20 | 50 | 670 | 9 | 50/ | soft |
| x - HMDS | 100 | 500 | 20 | 100 | 400 | 9 | >30(23)/ | hard |
| x - HMDS | 100 | 500 | 15 | 50 | 670 | 11 | 0/0 | soft |
| Mixtures with HMDS | | | | | | | | |
| +Ar | 70 | 500 | 20/5 | 29 | 670 | 5 | 20 | hard |
| +CH4 | 70 | 500 | 20/6 | 50 | 370 | 8 | 6 | hard |
| +H2 | 70 | 500 | 20/5 | 31 | 300 | 6 | 20 | hard |
| +H2 | 100 | 500 | 20/6 | 50 | 930 | 11 | 20(15)/0 | hard |
| +N2 | 70 | 500 | 20/5 | 35 | 500 | | | soft |
| +N2 | 70 | 500 | 20/6 | 50 | 600 | | | soft |
| +N2O | 33 | 400 | 20/6 | 50 | 310 | 6 | >75(50)/ | soft |
| +N2O | 70 | 500 | 20/5 | 50 | 1200 | | | soft |
| +N2O | 70 | 500 | 20/6 | 30 | 1700 | | | soft |
| +N2O | 100 | 400 | 10/4 | 50 | 700 | 14 | 25/0 | soft |

TABLE II-continued

| | Deposition conditions: | | | | | | | |
|---|---|---|---|---|---|---|---|---|
| Gas | Power (W) | Pres. (mTorr) | Flow (SCCM) | Temp. (C.) | Rate (Å/m) | Si % | RIE rate (Å/m) 250/100 V | Hardness |
| +N2O | 100 | 450 | 20/6 | 50 | 900 | | | soft |
| +N2O | 100 | 500 | 20/6 | 50 | ? | 3.5 | 780/3400 | soft rough surf |
| +N2O | 100 | 500 | 20/6 | 100 | 560 | | 85 | hard |
| +N2O | 100 | 600 | 20/5 | 50 | 1000 | | | soft |
| +NH3 | 70 | 500 | 20/6 | 50 | 600 | 3 | 35/ | hard |
| +SiH4 | 5 | 300 | 20/10 | 24 | 400 | 11 | >8/ | hard |
| +SiH4 | 5 | 300 | 20/20 | 23 | 320 | 11 | >10/ | hard |
| +SiH4 | 5 | 300 | 20/30 | 24 | 200 | 21 | >8/ | hard |
| +SiH4 | 10 | 300 | 20/10 | 50 | 180 | 19 | 15/ | hard |
| +SiH4/H | 10 | 300 | 20/5/20 | 50 | 270 | 12 | 20(5)/ | hard |
| +SiH4 | 40 | 400 | 10/5 | 50 | 560 | 14 | 20/0 | hard | x - HMDS = 50% HMDS and 50% XYLENE

Figure 2A:
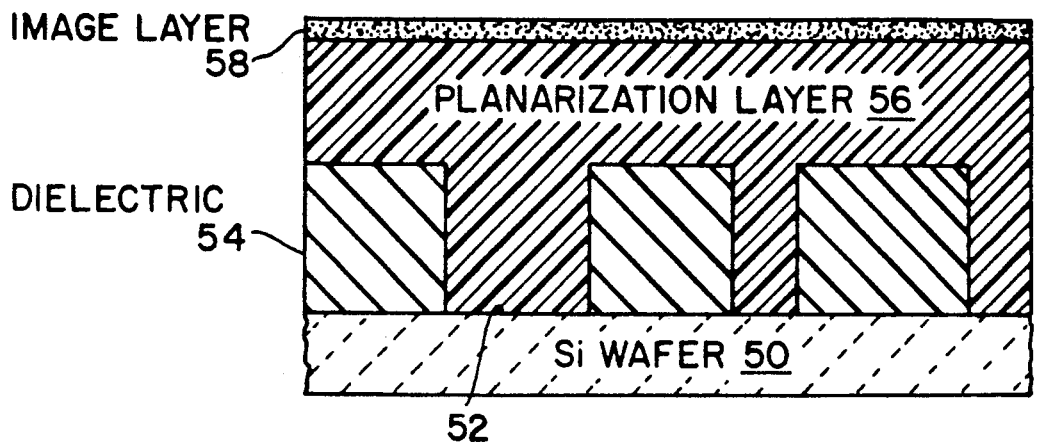
FIGS. 2(a) and 2(b) are schematic cross-sectional views showing a planarization layer system for forming a contact and via hole.
Figure 2B:
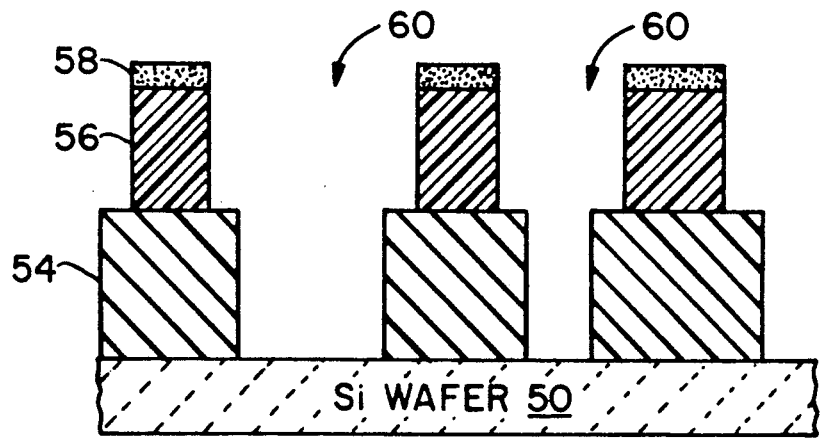

Referring now to FIG. 2, a typical application for the planarization film will now be described. In VLSI processing, it is often necessary to isolate regions of a Si wafer with a dielectric and to form contact openings and via holes through the dielectric for metallization. A dielectric insulator layer of SiO2 or Si3N4 is first formed by known processes on the Si wafer 50 and patterned to expose the Si wafer surface 52 where the contact is to be made; leaving a corrugated or step-like dielectric structure 54. This structure may be planarized by a layer 56 formed, as described above, in a PECVD chamber at low temperature. The composition of layer 56 varies, depending upon whether the layer 56 is to be a removable sacrificial layer, or will stay as an insulator. In the former case, an amorphous carbon layer is formed, while in the latter case, a silicon containing carbon layer is required.

A conventional image layer 58 of of Si/Ni/Al is then deposited, preferably in the same chamber, by PECVD, on the smooth planar surface of layer 56, and lithographic techniques used to etch contact openings 60 or vias to the substrate surface.

Figure 3A:
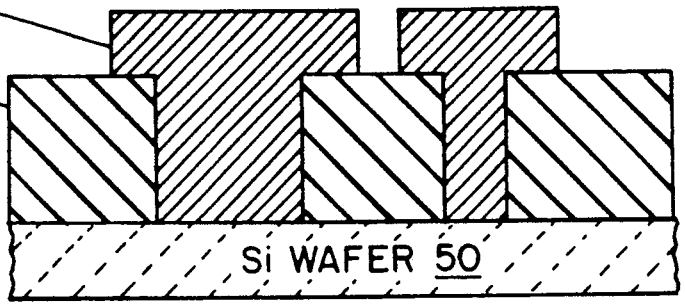
FIGS. 3(a) and 3(b) are is a schematic cross-sectional views showing a planarization layer removed after contact formation 3(a and left in the the circuit as a dielectric layer 3(b).
Figure 3B:
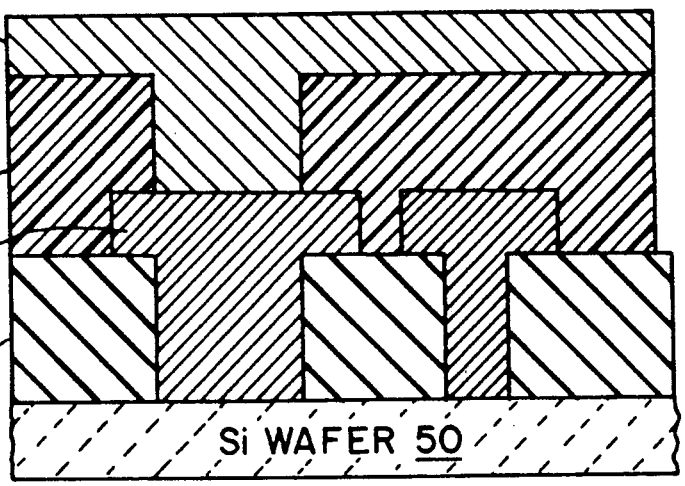

FIG. 3 illustrates another application for the invention in which the planarization layer 56 may be either removed, as in FIG. 3a, or left, as in FIG. 3b. Thus, in FIG. 3a, the layer 56 is removed by a solvent after the metal contacts 62 were formed in the contact openings. Whereas, in FIG. 3b, the planarization layer 56 is left to form an insulator upon which a second metal layer (64) may be formed.

Figure 4A:
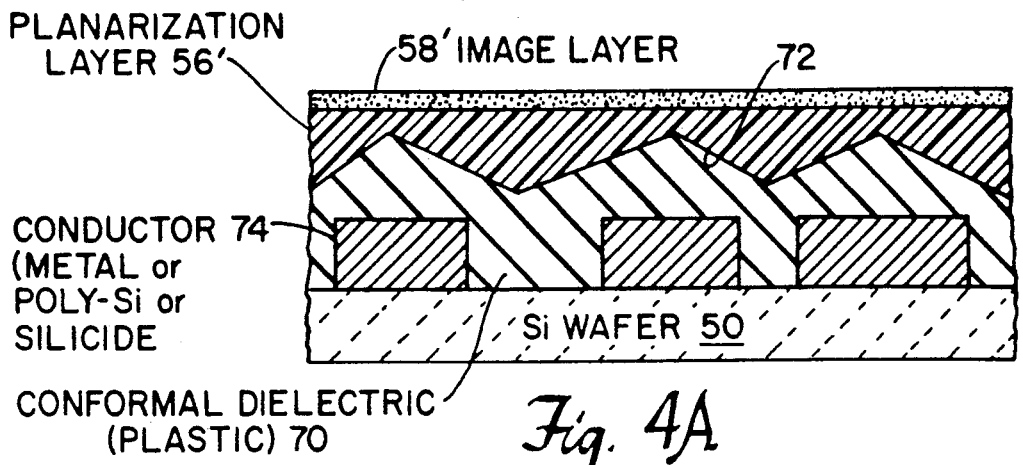
FIGS. 4(a),(b), and 4(c) are is a schematic cross-sectional views showing steps 4(a), 4(b), and 4(c) in forming a planarization layer over a conformal layer.
Figure 4B:
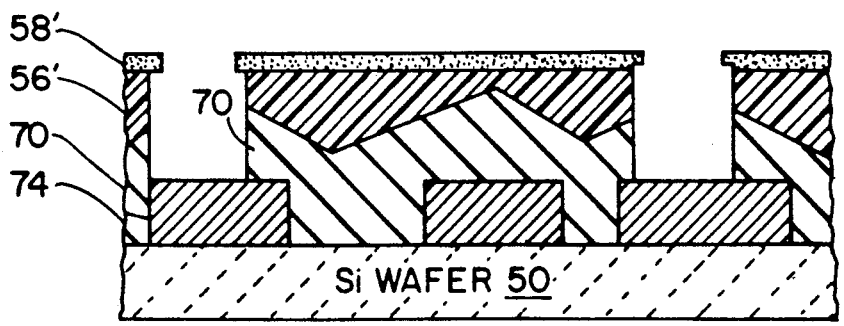
Figure 4C:
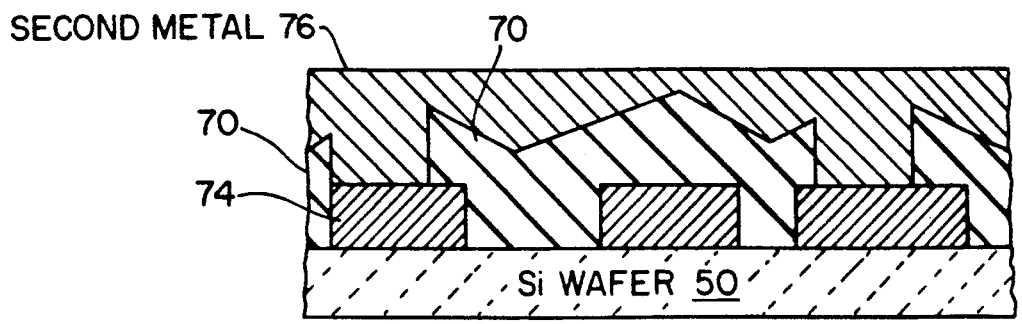

FIG. 4 shows the steps in forming a planarization layer 56' over a conformal layer 70. In this process, typically a metallized pattern 74 is formed on a silicon wafer and conformally coated, either conventionally, or using the hard coating PECVD process, to produce a dielectric layer 70 with a non-planar surface 72. Planarization layer 56' is formed over the layer 70, as described above. An image layer 58' is then deposited on layer 56' and patterned. The patterned openings are etched, as shown in FIG. 4b, to expose the underlying metal conductors 74. The image layer and planarization layer 56' are then dissolved and a second metal layer 76 formed over and through the conformal dielectric layer 70.

Figure 5A:
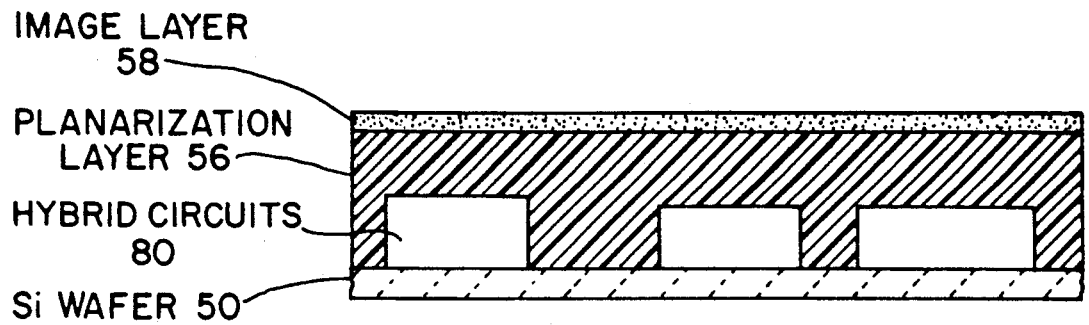
FIGS. 5(a), 5(b), and 5(c) are is a schematic cross-sectional views showing formation of a planarization layer for interconnection between circuits.
Figure 5B:
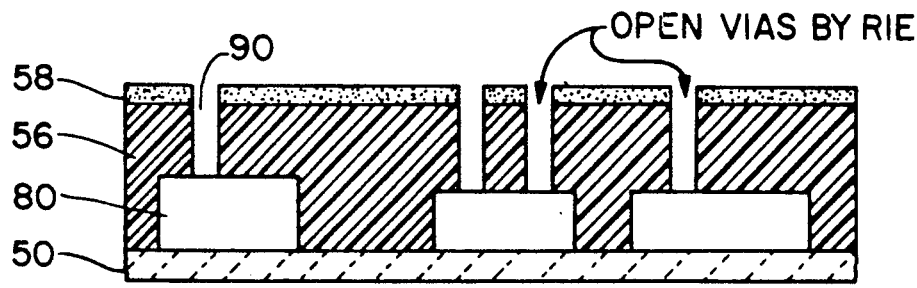
Figure 5C:
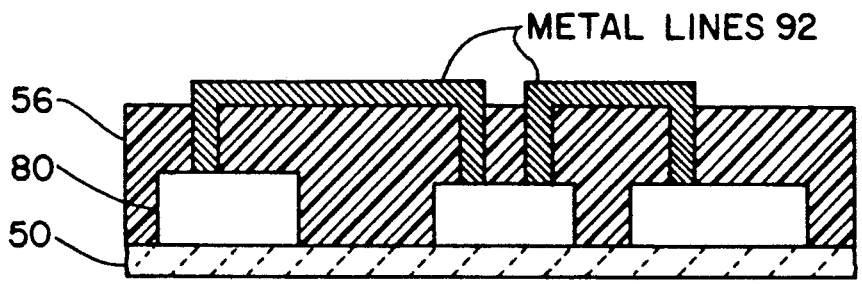

FIG. 5 shows yet another application for the invention wherein hybrid circuits 80 may be interconnected with the aid of a planarization layer 56. Hybrid circuits 80 are affixed to a common substrate, such as Si wafer 50, and a layer 56 formed over the non-planar structure, as described above, along with an image layer 58, preferably formed in the PECVD chamber (FIG. 5a). Note: It is also possible to form the layer 58 by other processes, such as E-beam evaporation, CVD, MBE, etc. The image layer may be patterned by any of the well-known processes, such as laser patterning, UV lithography, E-beam lithography, ion beam or X-ray lithography.

Vias 90 are formed by RIE using the image layer as a mask; and metal lines 92 are formed by using the CVD process at low temperature with gases, such as WF6 or Al(CH3)3.

In summary, we have achieved better than 95% planarization using films deposited by PECVD. This process has advantages over other conventional planarization techniques. The process is carried out at low temperature (20° C.) without bombardment by high energy ions. Since it does not require etching (back sputtering) of the deposited films (as needed in sputter deposit film), deposition rate is as high as 250 nm/min.

In addition, a high degree of planarization is obtained using a thin layer with thickness equal to the step height of the underlying profile. The fast deposition rate and thin layer needed can provide high wafer throughput. In comparison to spun-on layers using wet chemical, since no spinning is required, better uniformity and better planarization over large features are obtained.

While the process has been described in connection with VLSI circuits using Si wafers, it should be understood that other materials, such as III-V semiconductors, may be adapted for use in the process.

The R.F. power used for the deposition process can be converted to R.F. power density by simply dividing the power by the area of the electrode. In the experiments referenced, the area of the electrodes was about 500 cm$^2$ and the R.F. power typically used is less than 150 W, which is equivalent to 0.3 w/cm$^2$.

Some of the as-deposited planarization films do not have the desired electrical properties required as dielectric layers. Films containing relatively small C content and Si, N or 0, can be converted to good dielectric layers by further treatment after deposition. For example, the C in the film can be removed by thermal or plasma treatment in an 02 of N2 ambient.

Accordingly, the invention is not to be limited, except as defined in the following claims:

We claim:

1. In a plasma enhanced chemical vapor deposition chamber, having two oppositely disposed electrodes, a method of forming a planarization film on a substrate comprising the steps of:

(a) providing a substrate in said chamber;
 (b) flowing a reactant gas in said chamber;

(c) generating a plasma between said electrodes by R.F. power to dissociate said gas and deposit a predetermined planarization layer of carbonaceous material on said substrate; while maintaining said substrate at a relatively low temperature wherein the layer is soft as deposited and is then hardened by thermal or plasma treatment.

2. The method of claim 1 wherein the gas is taken from the class comprising: toluene, benzene, butadiene, HMDS and HMDS/Xylene.

3. The method of claim 1 wherein the low temperature is less than about 100° C.

4. The method of claim 1 wherein the R.F. power density is about 0.3 W/cm$^2$ or less.

5. The method of claim 1 wherein the chamber has an internal pressure more than about 500 mTorr.

6. The method of claim 1 wherein the flow rate of the gas is more than about 10 ccm.

7. The method of claim 1 wherein the layer is a dielectric.

8. The method of claim 1 wherein the layer is a conductor.

9. The method of claim 1 wherein the gas comprises a mixture of a hydrocarbon gas and a Si containing gas.

10. The method of claim 1 wherein the layer is readily dissolved in an organic solvent.

11. The method of claim 1 wherein the gas comprises a mixture of a hydrocarbon gas and a N containing gas.

12. In a plasma enhanced chemical vapor deposition chamber, having two oppositely disposed electrodes, a method of forming a planarization film on a substrate comprising the steps of:
 (a) providing a substrate in said chamber;
 (b) flowing a metal containing reactant gas in said chamber;
 (c) generating a plasma between said electrodes by R.F. power to dissociate said gas and deposit a predetermined planarization layer of metallic material on said substrate; while maintaining said substrate at a relatively low temperature wherein the layer is soft as deposited and is then hardened by thermal or plasma treatment.

13. The method of claim 12 wherein the gas mixture comprises gases taken from the class comprising: WF6, TiCl4, AlF3.

14. The method of claim 12 wherein the low temperature is less than about 100° C.

15. The method of claim 12 wherein the R.F. power density is about 0.3 w/cm$^3$ or less.

16. The method of claim 12 wherein the chamber has an internal pressure more than about 500 mTorr.

17. The method of claim 12 wherein the flow rate of the gas is more than 10 ccm.

18. The method of claim 12 wherein the layer is a conductor.

19. The method of claim 1 wherein the layer is a poor dielectric as deposited and is subjected to a plasma or thermal treatment to produce a good dielectric.

* * * * *